(12) United States Patent
Goltman et al.

(10) Patent No.: US 9,281,824 B2
(45) Date of Patent: Mar. 8, 2016

(54) CLOCK AMPLITUDE DETECTION

(71) Applicant: Intel Corporation, Santa Clara, CA (US)

(72) Inventors: Gennady Goltman, Haifa (IL); Yongping Fan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 46 days.

(21) Appl. No.: 13/836,951

(22) Filed: Mar. 15, 2013

(65) Prior Publication Data

US 2014/0266308 A1    Sep. 18, 2014

(51) Int. Cl.
*H03L 5/00* (2006.01)
*G01R 19/04* (2006.01)
*H03L 7/099* (2006.01)
*G01R 19/165* (2006.01)

(52) U.S. Cl.
CPC ........ *H03L 5/00* (2013.01); *G01R 19/04* (2013.01); *H03L 7/099* (2013.01); *G01R 19/16576* (2013.01)

(58) Field of Classification Search
CPC .. G01R 19/04; G01R 19/0038; H03K 5/1532; H03K 5/082; G11B 20/10009
USPC .......................................... 327/58, 65, 72, 73
See application file for complete search history.

(56) References Cited

U.S. PATENT DOCUMENTS

| | | | |
|---|---|---|---|
| 7,009,429 B2 * | 3/2006 | Eberlein | 327/72 |
| 7,116,948 B2 * | 10/2006 | Chien | 455/115.3 |
| 7,626,777 B2 * | 12/2009 | Aemireddy et al. | 360/25 |
| 8,258,816 B2 * | 9/2012 | Forbes | 327/65 |
| 8,497,711 B2 * | 7/2013 | Hsieh | 327/58 |
| 2005/0042995 A1 * | 2/2005 | Chien | 455/226.1 |

* cited by examiner

*Primary Examiner* — Quan Tra
(74) *Attorney, Agent, or Firm* — Green, Howard & Mughal LLP

(57) ABSTRACT

In some embodiments, disclosed is an AC amplitude detector to compare the magnitude of an AC signal against a detector threshold level and to provide an indication as to whether the AC magnitude is larger or smaller than the detector threshold level.

20 Claims, 3 Drawing Sheets

CLOCK AMPLITUDE DETECTION

TECHNICAL FIELD

The present invention relates generally to AC amplitude detectors, and in particular, to an amplitude detector for a phase locked loop oscillator.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
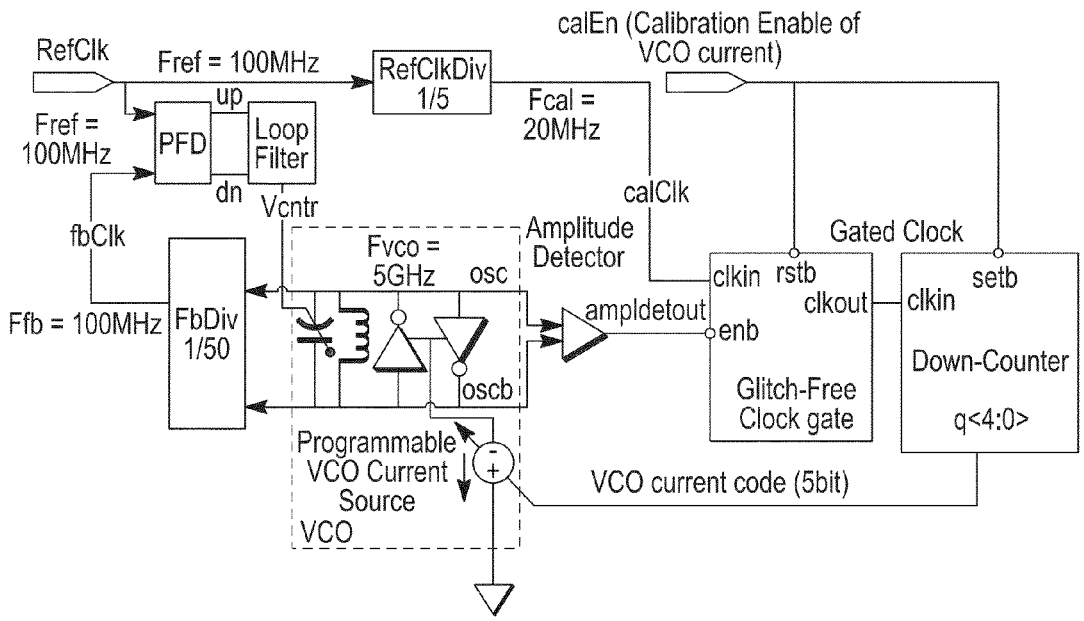
FIG. 1 is a block diagram of a PLL with an automatic amplitude control loop having an amplitude detector in accordance with some embodiments.

FIG. 1 is a block diagram of an IO interface (e.g., PCI-Express Gen2) clock generator PLL with an automatic amplitude control loop based on amplitude detectors disclosed herein. The PLL uses an LCVCO (inductor capacitor voltage controlled oscillator). LC-PLLs are commonly used for applications requiring low jitter and high speed clocks such as PCIe Gen2/Gen3/Gen4 and SerDes (25 GB/s to 40 GB/s), to mention just a few. One of the design issues is how to implement the VCO (voltage controlled oscillator) or DCO (digitally controlled oscillator) amplitude, and start-up condition, dependence on LC tank Q and transistor gm inconsistencies caused by process and temperature variations. An automatic amplitude control (AAC) loop may be desired for reliable start-up of the VCO and for low jitter operation, which requires optimum oscillation amplitude without consuming unnecessarily high power.

The depicted PLL (PCIe) receives a 100 MHz reference clock (refClk) and produces a 5 GHz output clock. As shown in the figure, the PLL uses a complimentary LC VCO, based on two antiparallel current starved inverters. VCO amplitude is defined by a programmable VCO current source supplying ground current to the inverters. The current produced by the programmable current source is defined by a 5-bit down-counter through a VCO current code channel. The depicted amplitude detector is connected to both positive (osc) and negative (oscb) outputs of the VCO. The output of amplitude detector (ampldetout) produces an enable signal for a glitch-free clock gate, which drives the clock input of the down-counter. The clock entering the Glitch-Free Clock Gate (calClk) is the PLL reference clock divided by 5 (20 MHz).

An amplitude control calibration sequence will now be described. In an initial state, the calibration enable input (calEn) of the PLL is at a Low logic level, which means that the glitch free clock gate is in a reset state and is not transparent. Therefore, the calClk clock does not drive the down-counter. The down-counter is in a set state and therefore, the binary code on its output is 11111. This code corresponds to the maximum current produced by the programmable VCO current source and thus, the VCO is running on maximum amplitude. For example, assume that the single ended amplitude (Vm) of the VCO output is 300 mV, 600 mv peak-to-peak. (This is shown at time unit 1.1 on FIG. 5.) The amplitude detector output (ampldetout) is at a Low level because the VCO amplitude (Vm=300 mV) is bigger than the amplitude detector threshold, which is 276 mV in this example.

Calibration begins when the calEn (calibration enable) input is forced to a High logic level. The glitch free clock gate and down-counter move to an active operation state. The clock gate becomes transparent because the signal coming from the amplitude detector to the clock gate enb input is Low. A 20 MHz clock reaches the clock input of the down-counter and it begins transitioning down from the maximum all ones state. With each state, the current produced by the programmable VCO current source decreases and thus, the VCO output clock amplitude also decreases (as shown on FIG. 5).

When the amplitude of the VCO output becomes lower than the threshold level of the amplitude detector (270 mV in our example), the amplitude detector output (ampldetout) goes High. this causes the glitch free clock gate to immediately de-assert at clkout, the clock input (clkin) of the down-counter. This freezes the state of the down-counter and in turn, the VCO current source. This leaves the VCO amplitude at (or substantially near) the amplitude detector threshold level, e.g., 270 mV in this example. (In FIG. 5, this occurs at time unit 1.4.)

(It should be appreciated that this is an example of one amplitude calibration implementation. Other implementations, for example, could also shut down the power of the amplitude detector after the down-counter is locked in order to reduce power consumed by the PLL. In addition, the calibration process could be performed faster if the routine (e.g., state machine) would utilize a binary search algorithm.)

Figure 2:
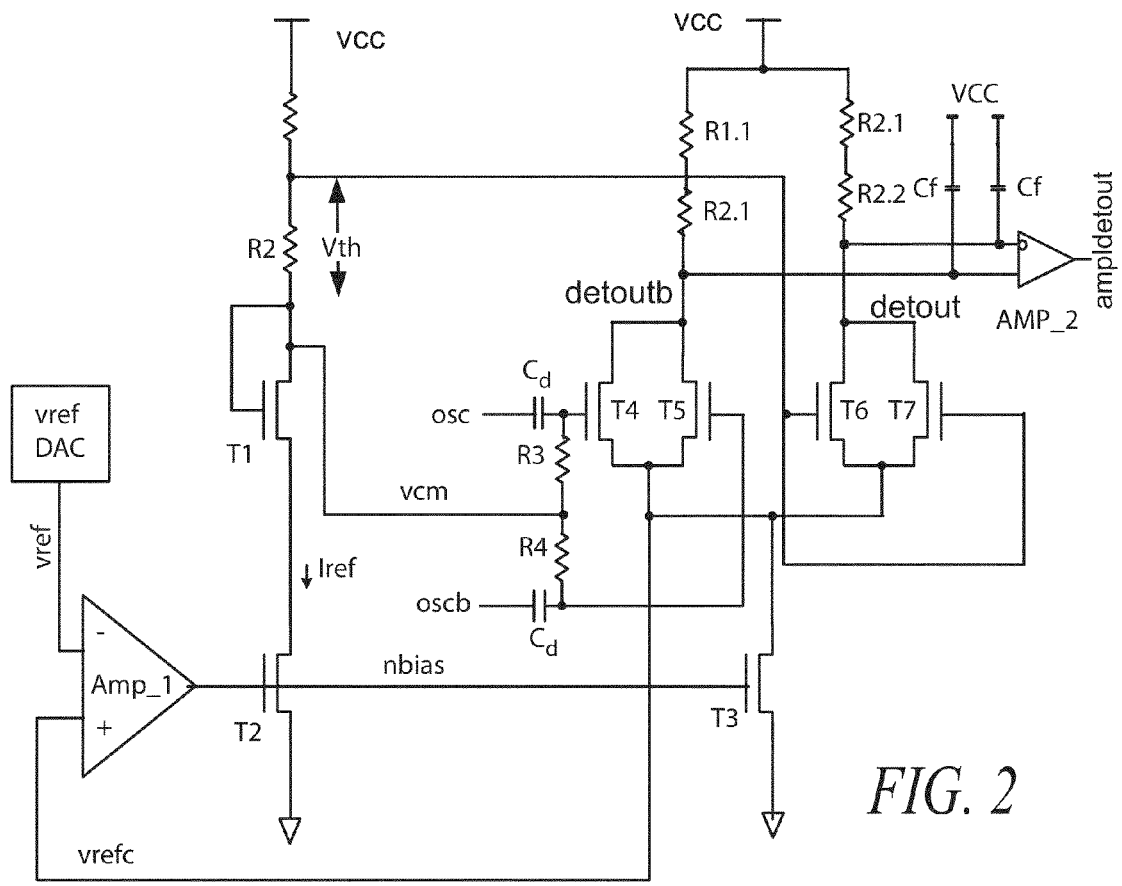
FIG. 2 is a schematic diagram of an amplitude detector circuit in accordance with some embodiments.

FIG. 2 shows an amplitude detector circuit. It uses an AC differential amplitude comparator with an AC input at Osc/Oscb and a an output at ampldetout. When the magnitude of an AC voltage applied to Osc/Oscb exceeds an amplitude detector threshold level, ampldetout will be at a first state (low in this case) and when the Osc/Oscb AC magnitude is smaller than the amplitude detector threshold level, then the ampldetout will be at a second state (High in this case).

The AC amplitude differential comparator is formed from a differential pair amplifier (resistors R1.1, R1.2, R2.1, R2.2 and transistors T3-T7), a common mode AC input interface (formed from decoupling capacitors Cd and resistors R3, R4), filter capacitors (Cf), and a DC comparator (Amp_2), all coupled together as shown. Transistors T4-T7 define a differential pair whose strength is controlled through current source transistor T3.

The differential pair amplifier's gain and internal threshold (AC magnitude trip voltage) are controlled by threshold reference circuitry formed from DC reference (Vref DAC), diff. amplifier (Amp_1), transistors T1-T2), and resistors R1, R2. Differential amplifier Amp_1 and transistors T2-T3 form a closed bias generator loop for the differential pair (T4-T7). The DC reference (Vref DAC), resistors R1, R2 and diode-connected transistor T1 define the internal threshold level for the AC comparator.

The differential pair amplifier (T3-T7) has differential output nodes (detout, detoutb) that are filtered by low-pass filter capacitors (Cf) and applied to inputs of high gain comparator (Amp_2), which provides the detector output (ampldetout). The inputs of the T6/T7 side of the differential pair are connected together and coupled to a vref_int node. The voltage level at vref_int will be: Vcm+Iref×R2, where Vcm is the voltage at node Vcm and Iref is a reference current through transistors T1, T2 and resistors R1, R2.

The equivalent input voltage of the T4/T5 side of the differential pair is Vcm+Vm/CG, where Vm is the single ended amplitude on the Osc and Oscb inputs and CG is a gain presenting ratio between the amplitude of the single ended voltage applied to one input to the equivalent DC voltage applied to the other input. In some embodiments, this CG value may be between 1.7 and 2, depending on the comparator operation point, temperature and process.

The differential pair comparator will change its state when: Vcm+Vm/CG=Vcm+Iref×R2. Therefore the threshold voltage of the amplitude detector is equal to the voltage drop across R2 (Vth) multiplied by CG (CG×Iref×R2). This also means that the voltage drop on resistor R2 (Vth) directly defines the threshold amplitude for the amplitude detector.

The differential amplifier (Amp_1) serves as a closed loop feedback detector for controlling the threshold current (Iref) and the driver strength of the differential pair amplifier through current source T3. One input of the amplifier is connected to reference voltage (Vref DAC) and the other input (vrefc) is connected to the drain of transistor T3. The amplifier output (nbias) controls the differential pair current through transistor T3 and the threshold current (Iref) through T2. The threshold current (Iref) defines the threshold voltage (Vth) of the amplitude detector. This control loop makes the drain voltage of T2 and T3 stable and equal to vref (Vref DAC).

Unfortunately, this design does not substantially stabilize the current through R2, which depends on the threshold voltage (VT) of transistor T1 and the resistances of R1 and R2. Therefore, the threshold voltage of the amplitude detector may undesirably depend excessively on process, supply voltage, and temperature variations.

Figure 3:
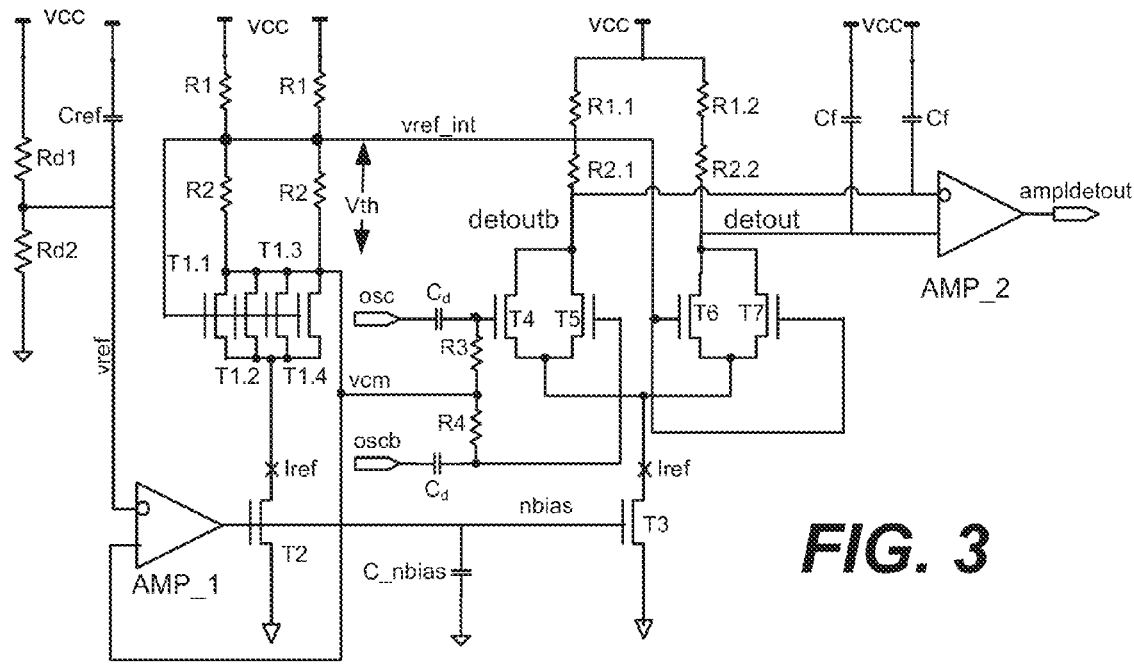
FIG. 3 is a schematic diagram of another amplitude detector circuit in accordance with some embodiments.

FIG. 3 shows an improved amplitude detector, for at least some implementations, over the design of FIG. 2. As with the FIG. 2 detector, it uses a differential pair amplifier (T3-T7) for AC voltage comparison, and its detector threshold voltage is defined by the voltage drop on resistor R2. However, among others, there are several differences. For example, its DC reference source tracks the PLL supply, and its feedback is configured differently. Rather than tracking off of the diff. pair current (T3 drain), it instead tracks off of the threshold (Iref) reference circuitry ((R1, R2, T1.1-T1.4, T2). In the depicted embodiment, specifically, it tracks off of the Vcm node, which is connected to the drains of T1.1-T1.4. One input of the feedback amplifier (Amp_1) is connected to DC reference voltage source (vref) and the other input is connected directly to the Vcm node. This means that the amplitude detector threshold current, and thus, the amplitude detector threshold, itself, is more tightly controlled and less sensitive to variations in process, MOS threshold values, and temperature variations.

However, because the differential pair strength (through its current source T3) is now not directly controlled in the closed loop against the DC reference (vref), its components, at least in some ideal embodiments, are made to be replicas of their counterpart bias and threshold components (on the left side of the figure). In some replica implementations, R1=R1.1=R1.2; R2=R2.1=R2.2; T2=T3; and T1.1=T1.2=T1.3=T1.4=T4=T5=T6=T7. Even more ideally, corresponding components are matched in their layout. This makes the differential pair amplifier, which is not directly controlled through the feedback loop, operate more stably in cooperation with the threshold reference circuitry.

As mentioned above, another difference from the FIG. 2 detector pertains to its DC reference (vref). In this FIG. 3 embodiment, lref is created from a PLL supply voltage divider made from two matched resistors (Rd1, Rd2)). Thus, vref, which controls the amplitude detector threshold voltage, tracks PLL Vcc and, as a result, causes the VCO amplitude to be proportional to the VCO supply voltage (Vcc). That is, the feedback loop forces the voltage drop on resistors R1 and R2, between Vcm and Vcc, to be equal to the voltage on Vref. There are also two capacitors, Cref and C_nbias. Capacitor Cref is used to reduce noise propagation from Vcc to Vref, while capacitor C_nbias is used for stabilization of the nbias loop.

Figure 4:
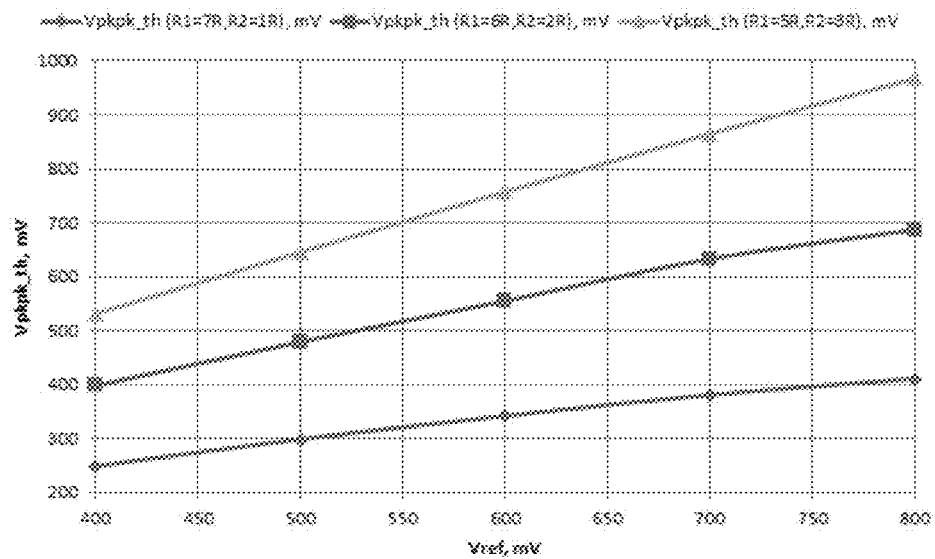
FIG. 4 is a graph showing amplitude detector threshold dependence based on Vref and threshold resistor ratios for the amplitude detector of FIG. 3.

With this design, the amplitude detector threshold can not only be varied by changing vref, but also, it can be varied with a constant vref by changing the ratio between the R1 and R2 resistors. This is illustrated in FIG. 4, which shows how the amplitude detector threshold can be controlled over a wide range by both or any of Vref and the ratio of resistors R1 and R2.

Figure 5:
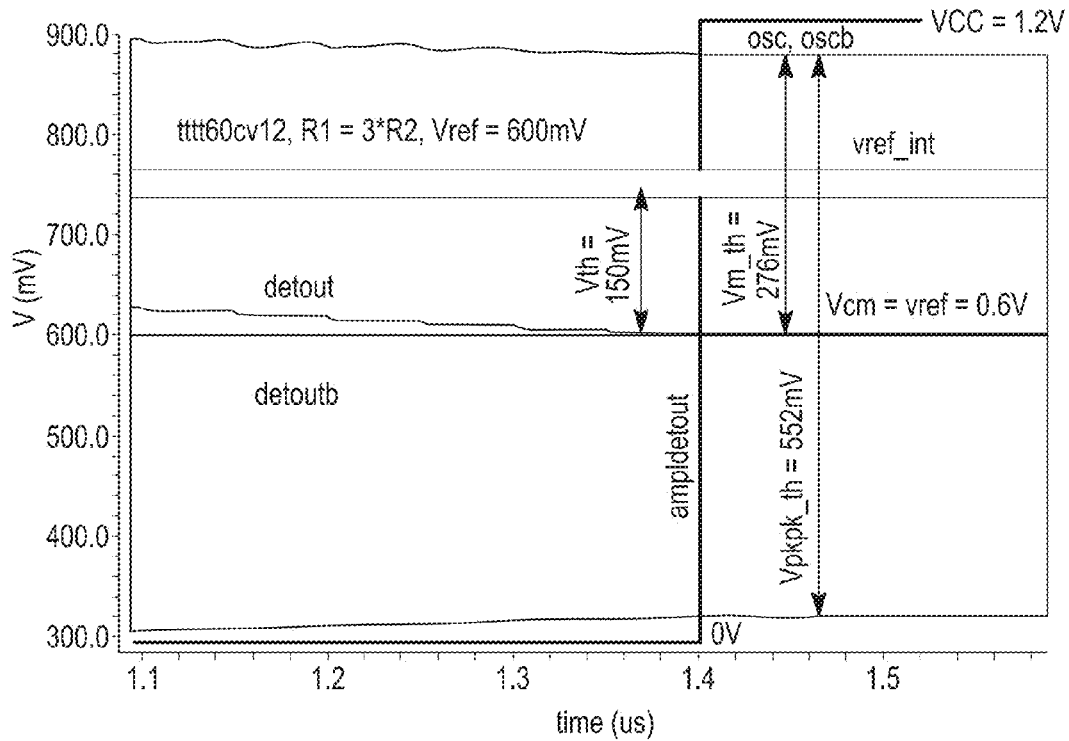
FIG. 5 is a graph showing signals inside the PLL of FIG. 1 and amplitude detector of FIG. 3 during a VC0 amplitude calibration in accordance with some embodiments.
Figure 6:
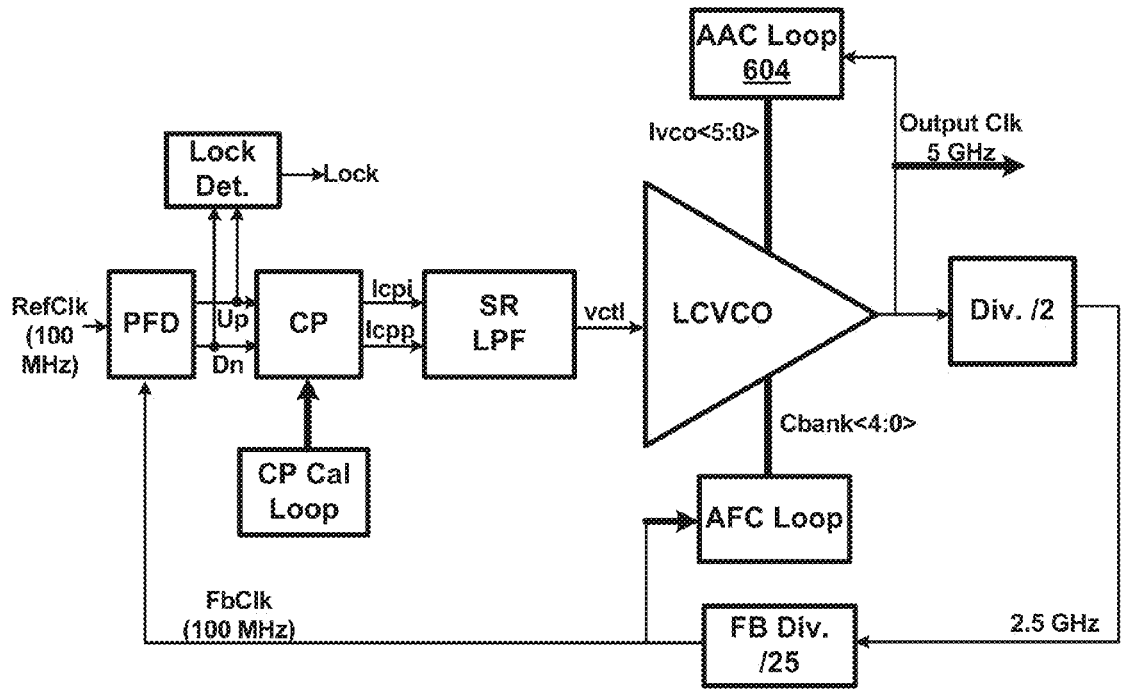
FIG. 6 is a block diagram showing a PLL for use in a PCI Express clock generation implementation in accordance with some embodiments.

FIG. 5. shows some signals within the amplitude detector of FIG. 3, which is part of an automatic amplitude control system (see FIGS. 1 and 6). This shows how that in some implementations, the amplitude is set by starting the VCO with the highest oscillation amplitude (e.g., as defined by the VCO current code in FIG. 1). When the VCO amplitude reaches the target (550 mV in FIG. 5), the AAC freezes the digital codes that control the VCO current, maintaining the desired VCO oscillation amplitude.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors (including processors for mobile and server platforms), controllers, chip set components, programmable logic arrays (PLA), memory chips, network chips, and the like. In particular, the disclosed LCPLL calibration methods and circuits could be used for any LCPLL applications, including but not limited to on-chip clock generation and RF applications. For example, it could be used in transceivers (transmitters and/or receivers) for platform interfaces such as PCIe, MIPI, USB, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip with an amplitude detector, comprising:
   a differential pair amplifier having an AC interface to receive first and second AC signals generated by a controllable oscillator, the first and second AC signals with associated magnitudes, the first and second AC signals to cause the differential pair amplifier to change state at an output when at least one of the associated magnitudes exceeds a detector threshold level, the AC interface having first and second AC coupling capacitors, to receive the first and second AC signals, respectively;
   a threshold reference circuitry to control the detector threshold level; and
   a voltage amplifier to control in a closed loop the threshold reference circuitry against a DC reference wherein the voltage amplifier has an output coupled to a first current source for the threshold reference circuitry and to a second current source for the differential pair amplifier.

2. The chip of claim 1, wherein the differential pair amplifier comprises first and second differential transistor pairs, the first differential transistor pair having first and second inputs coupled to the AC interface.

3. The chip of claim 2, wherein the first and second AC coupling capacitors are to couple the first and second inputs to receive the first and second AC signals.

4. The chip of claim 3, wherein the AC interface comprises first and second resistors coupled in series between the first and second inputs of the first differential transistor pair, the first and second resistors being coupled together at a common mode node.

5. The chip of claim 4, wherein the common mode node is coupled to the threshold reference circuitry.

6. The chip of claim 5, wherein the common mode node is coupled to the voltage amplifier to be compared against the DC reference.

7. The chip of claim 1, where the controllable oscillator is a PLL oscillator having an associated PLL voltage supply, wherein the PLL oscillator is to generate the AC signal to be received.

8. The chip of claim 7, wherein the DC reference is derived from a voltage divider supplied by the associated PLL voltage supply.

9. The chip of claim 1, wherein the threshold reference circuitry comprises one or more transistors matched to transistors forming the differential pair amplifier.

10. The chip of claim 9, wherein the one or more transistors of the threshold reference circuitry are coupled to the voltage amplifier to be compared against the DC reference in a closed loop to control the current in the threshold reference circuitry.

11. The chip of claim 1, wherein the differential pair amplifier has an associated current source to control differential pair current, and wherein the threshold reference circuitry has an associated current source to control threshold reference current, the differential pair amplifier to be matched to corresponding components in the threshold reference circuitry so that the differential pair current and threshold reference current are equivalent.

12. A chip, comprising:
   an amplifier detector having a differential amplifier with first and second input pairs, the first input pair to facilitate an AC input for an oscillator output, the second input pair to be coupled to a threshold reference circuit that is controlled in a closed loop against a control reference, the amplitude detector having an output to be at a first logic state when an AC magnitude at the AC input is greater than an amplitude detector threshold level and to be at a second logic state when the AC magnitude is less than the amplitude detector threshold level, the amplifier detector having two AC coupling capacitors to receive the AC input wherein the closed loop comprises:
   a control amplifier having a first input coupled to the control reference,
   a second input coupled to a node in the threshold reference circuit, and
   an output coupled to a reference current source to supply current to the threshold reference circuit.

13. The chip of claim 12, wherein the control reference is generated from a voltage divider circuit supplied from a power supply used to power an oscillator with an output coupled to the AC input.

14. The chip of claim 13, wherein the oscillator is a DCO.

15. A computing platform, comprising:
   an AC amplitude detector to compare a magnitude of an AC signal from an oscillator against a detector threshold level and to provide an indication as to whether the magnitude of the AC signal is larger or smaller than the detector threshold level, the detector threshold level to be controlled in a closed loop control circuit, where the AC amplitude detector includes at least one AC coupling capacitor to receive the AC signal, wherein the closed loop control circuit has an amplifier to compare a voltage on a node in a threshold reference circuit against a control voltage.

16. The computing platform of claim 15, wherein the AC amplitude detector is part of a system for controlling a PLL in a PCI Express I/O interface.

17. The apparatus of claim 3, wherein the second differential transistor pair has first and second inputs which are coupled together.

18. The apparatus of claim 17, wherein the first and second inputs are biased by the threshold reference circuitry.

19. The apparatus of claim 3, wherein the first and second differential transistor pairs share a common current source.

20. The apparatus of claim 3, wherein the first differential transistor pair has a first output, wherein the second differential transistor pair has a second output, and wherein the first and second outputs are received by a second amplifier.

* * * * *